US012322858B2

(12) United States Patent
An et al.

(10) Patent No.: US 12,322,858 B2
(45) Date of Patent: Jun. 3, 2025

(54) DISPLAY STRUCTURE INCLUDING DIELECTRIC MATERIAL AND ELECTRONIC DEVICE INCLUDING SAME

(71) Applicant: Samsung Electronics Co., Ltd., Suwon-si (KR)

(72) Inventors: Jungchul An, Suwon-si (KR); Kwanghee Ryu, Suwon-si (KR); Myeongsu Oh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 332 days.

(21) Appl. No.: 17/893,821

(22) Filed: Aug. 23, 2022

(65) Prior Publication Data
US 2022/0407219 A1 Dec. 22, 2022

Related U.S. Application Data

(63) Continuation of application No. PCT/KR2022/001768, filed on Feb. 4, 2022.

(30) Foreign Application Priority Data

Feb. 5, 2021 (KR) .................. 10-2021-0016877
May 4, 2021 (KR) .................. 10-2021-0058047

(51) Int. Cl.
*H01Q 1/24* (2006.01)
*H04M 1/02* (2006.01)
(Continued)

(52) U.S. Cl.
CPC ............ *H01Q 1/243* (2013.01); *H04M 1/026* (2013.01); *H05K 5/0018* (2022.08);
(Continued)

(58) Field of Classification Search
CPC ........ G09F 9/30; H01Q 1/243; H04M 1/0216; H04M 1/026; H04M 1/0268; H05K 5/0018; H05K 5/0226; H05K 5/03
See application file for complete search history.

(56) References Cited

U.S. PATENT DOCUMENTS 5,936,613 A * 8/1999 Jaeger ................. G02F 1/13306
345/184
9,182,820 B1 * 11/2015 Hebenstreit .......... G09B 21/003
(Continued)

FOREIGN PATENT DOCUMENTS

CN 111384585 7/2020
EP 3761616 1/2021
(Continued)

OTHER PUBLICATIONS

Extended European Search Report dated Apr. 30, 2024 issued in European Patent Application No. 22750054.3.
(Continued)

*Primary Examiner* — Thien M Le
(74) *Attorney, Agent, or Firm* — Nixon & Vanderhye P.C.

(57) ABSTRACT

An electronic device of various embodiments of the disclosure may include: a housing, a wireless communication circuit disposed inside the housing and configured to transmit and/or receive a signal of a specified frequency by feeding to at least a part of the housing, and a display structure coupled to the housing. The display structure may include: a cover glass coupled to the housing and forming at least a part of a front surface of the electronic device, a display panel disposed adjacent to one surface of the cover glass, a first layer including a dielectric material disposed under the display panel, and having a first edge spaced apart from the first side surface by a first distance, and a second layer disposed under the first layer, wherein a second edge of the second layer corresponding to the first edge of the first
(Continued)

layer is spaced apart from the first side surface by a second distance less than the first distance. An edge of the display panel corresponding to the first edge of the first layer may be spaced apart from the first side surface by a third distance greater than the second distance and less than the first distance.

19 Claims, 10 Drawing Sheets

(51) Int. Cl.
  *H05K 5/00* (2006.01)
  *H05K 5/02* (2006.01)
  *H05K 5/03* (2006.01)
(52) U.S. Cl.
  CPC ............ *H05K 5/0226* (2013.01); *H05K 5/03* (2013.01); *H04M 1/0216* (2013.01)

(56) References Cited

U.S. PATENT DOCUMENTS

| | | | | |
|---|---|---|---|---|
| 10,836,970 | B2* | 11/2020 | Berkhous | C10G 45/02 |
| 11,462,589 | B2* | 10/2022 | Wang | H10K 59/353 |
| 11,495,772 | B2* | 11/2022 | Jiang | H10K 50/844 |
| 12,080,580 | B2* | 9/2024 | Cho | H01L 33/0095 |
| 2014/0355194 | A1 | 12/2014 | Shiraishi et al. | |
| 2015/0131009 | A1* | 5/2015 | Degiovine | G06F 1/1656 349/12 |
| 2015/0338711 | A1* | 11/2015 | Chang | H01L 23/538 257/91 |
| 2016/0204124 | A1* | 7/2016 | Yen | G02F 1/133514 257/40 |
| 2017/0365916 | A1* | 12/2017 | Wu | H01Q 5/30 |
| 2019/0320048 | A1 | 10/2019 | Yang et al. | |
| 2020/0163231 | A1 | 5/2020 | Park | |
| 2020/0221587 | A1 | 7/2020 | An | |
| 2022/0131276 | A1 | 4/2022 | Kim et al. | |
| 2022/0399375 | A1* | 12/2022 | Wang | H01L 27/1218 |
| 2023/0006171 | A1 | 1/2023 | Choi et al. | |

FOREIGN PATENT DOCUMENTS

| | | |
|---|---|---|
| JP | WO2013/108311 | 5/2015 |
| KR | 10-2019-0052475 | 5/2019 |
| KR | 10-2019-0077292 | 7/2019 |
| KR | 10-2020-0086505 | 7/2020 |
| KR | 10-2020-0100385 | 8/2020 |
| KR | 10-2021-0004752 | 1/2021 |

OTHER PUBLICATIONS

International Search Report for PCT/KR2022/001768 dated May 23, 2022, 5 pages.
Written Opinion of the ISA for PCT/KR2022/001768 dated May 23, 2022, 3 pages.

\* cited by examiner

DISPLAY STRUCTURE INCLUDING DIELECTRIC MATERIAL AND ELECTRONIC DEVICE INCLUDING SAME

CROSS-REFERENCE TO RELATED APPLICATIONS

This application is a continuation of International Application No. PCT/KR2022/001768 designating the United States, filed on Feb. 4, 2022, in the Korean Intellectual Property Receiving Office and claiming priority to Korean Patent Application No. 10-2021-0016877, filed on Feb. 5, 2021, in the Korean Intellectual Property Office, and to Korean Patent Application No. 10-2021-0058047, filed on May 4, 2021, in the Korean Intellectual Property Office, the disclosures of all of which are incorporated by reference herein in their entireties.

BACKGROUND

Field

The disclosure relates to a display structure including a dielectric material and an electronic device including the same.

Description of Related Art

As the processing performance of electronic devices such as smart phones increases greatly, large-area displays are preferred in order to effectively provide various functions. Concurrently with this, there is still a demand for miniaturization of the electronic devices for the sake of portability improvement, too. To satisfy this demand, foldable electronic devices are being released. The foldable electronic devices that may be folded or unfolded centering on a connecting part may provide portability and usability to users.

On the other hand, with the development of mobile communication technologies, electronic devices including antennas are being supplied widely. Using the antenna, the electronic device may transmit and/or receive a radio frequency (RF) signal including a voice signal or data (e.g., a message, a photo, a video, a music file, or a game).

Also, to satisfy consumers' purchasing desires, efforts are being made to increase the rigidity of the electronic device, strengthen a design aspect, and at the same time, achieve slimming. As part of such efforts, the electronic device feeds to at least a part of a housing of the electronic device and utilizes it as at least one antenna device for communication of the electronic device.

A foldable electronic device using at least a part of a frame or housing as an antenna radiator in an electronic device may include a metal layer for securing the rigidity of a flexible display and protecting a display structure. However, as the metal layer occupies 50% or more of the display structure, a weight of the electronic device may be reduced by changing a material of the metal layer into a lightweight material.

However, when the metal layer is formed of this lightweight material, the corresponding lightweight material may have a high permittivity. As a layer formed of a material having a high permittivity forms the outermost edge of the display structure, the radiation performance of an antenna adjacent to this layer may be deteriorated.

SUMMARY

An electronic device according to various example embodiments of the disclosure may include: a housing including: a first housing including a first side surface of the electronic device, a second housing including a second side surface corresponding to the first side surface, and a hinge connecting the first housing and the second housing; the electronic device configured to be switchable to a folded or unfolded state about the hinge, a wireless communication circuit disposed inside the housing and configured to transmit and/or receive a signal of a specified frequency by feeding to at least a part of the housing, and a display structure coupled to the housing. The display structure of an example embodiment may include: a cover glass coupled to the housing and forming at least a part of a front surface of the electronic device, a display panel disposed adjacent to one surface of the cover glass, a first layer including a dielectric material and disposed under the display panel, wherein the display structure has a first edge spaced apart from the first side surface by a first distance, and a second layer disposed under the first layer, wherein a second edge of the second layer corresponding to the first edge of the first layer is spaced apart from the first side surface by a second distance less than the first distance. An edge of the display panel corresponding to the first edge of the first layer may be spaced apart from the first side surface by a third distance greater than the second distance and less than the first distance.

An electronic device according to various example embodiments of the disclosure may include: a housing including: a first housing including a first side surface of the electronic device, a second housing including a second side surface corresponding to the first side surface, and a hinge connecting the first housing and the second housing, the electronic device configured to be switchable to a folded or unfolded state about the hinge, and a display coupled to the housing. The display may include: a cover glass coupled to the housing and forming at least a part of a front surface of the electronic device, a display panel disposed adjacent to one surface of the cover glass, a first layer including a dielectric material and disposed under the display panel, wherein a first edge of the first layer is spaced a first distance apart from the first side surface, and a second layer disposed under the first layer, wherein a second edge of the second layer corresponding to the first edge of the first layer is spaced apart from the first side surface by a second distance less than the first distance. An edge of the display panel corresponding to the first edge of the first layer may be spaced apart from the first side surface by a third distance greater than the second distance and less than the first distance.

A display according to various example embodiments of the disclosure may include: a cover glass forming a first outer surface of the display structure, a flexible display panel disposed under the cover glass, a first layer having a first edge, at least part of which is formed inside an edge of the flexible display panel, and disposed under the flexible display panel, and including a dielectric material, and a second layer having a second edge, at least part of which is formed outside the edge of the flexible display panel, and disposed under the first layer.

According to various example embodiments of the disclosure, the deterioration of antenna performance due to the application of a lightweight material to a metal layer may be improved.

According to various example embodiments, the damage or deformation of a display structure capable of occurring as a metal layer employs a lightweight material and a structure thereof is changed may be reduced.

Besides this, various effects directly or indirectly understood through the disclosure may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which.

In relation to a description of the drawings, the same or similar reference numerals may be used for the same or similar elements.

DETAILED DESCRIPTION

Hereinafter, various example embodiments of the disclosure will be described in greater detail with reference to the accompanying drawings. However, this is not intended to limit the disclosure to specific embodiments, and it should be understood that various modifications, equivalents, and/or alternatives of the various example embodiments of the disclosure are included.

Figure 1:
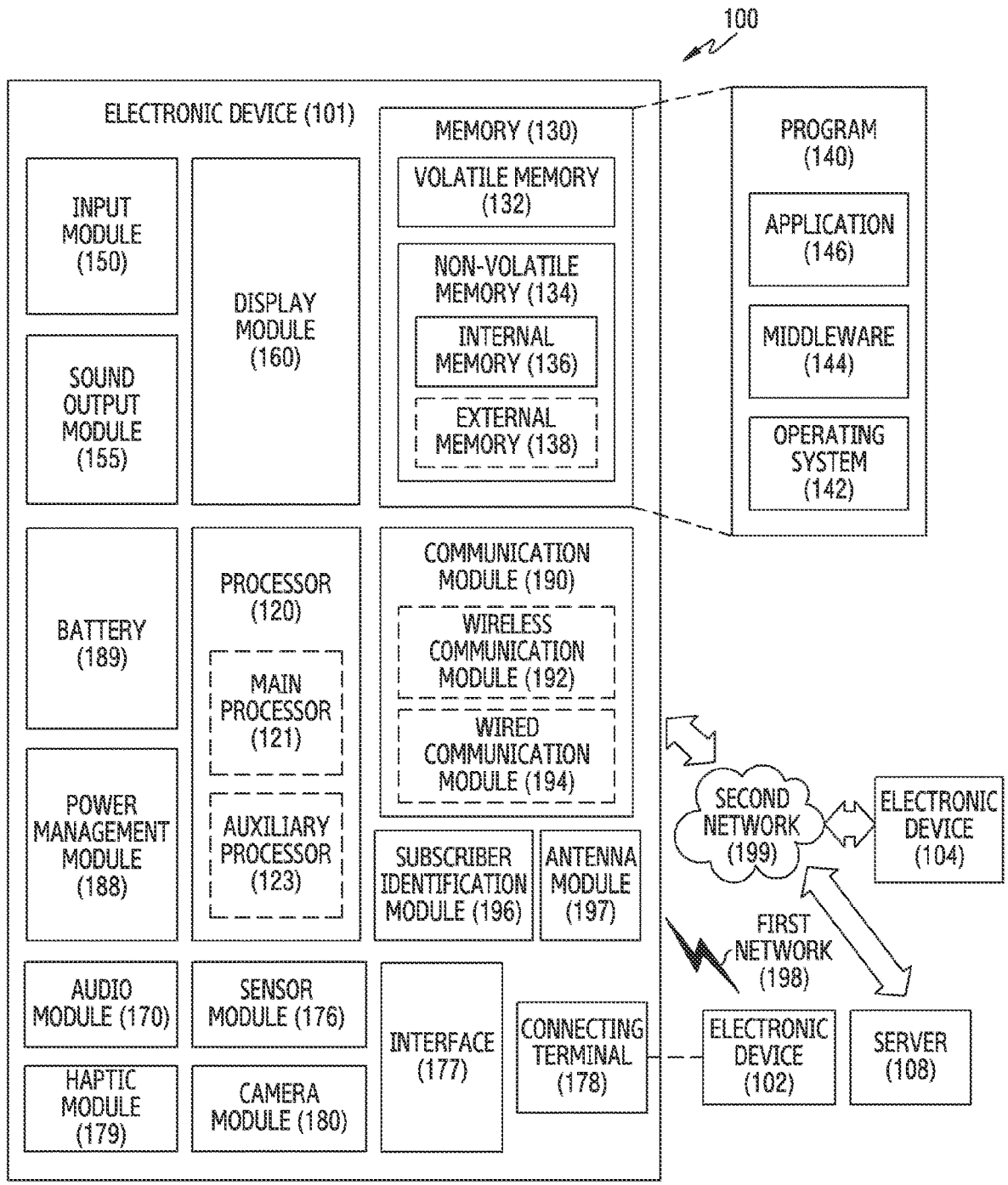
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196. The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
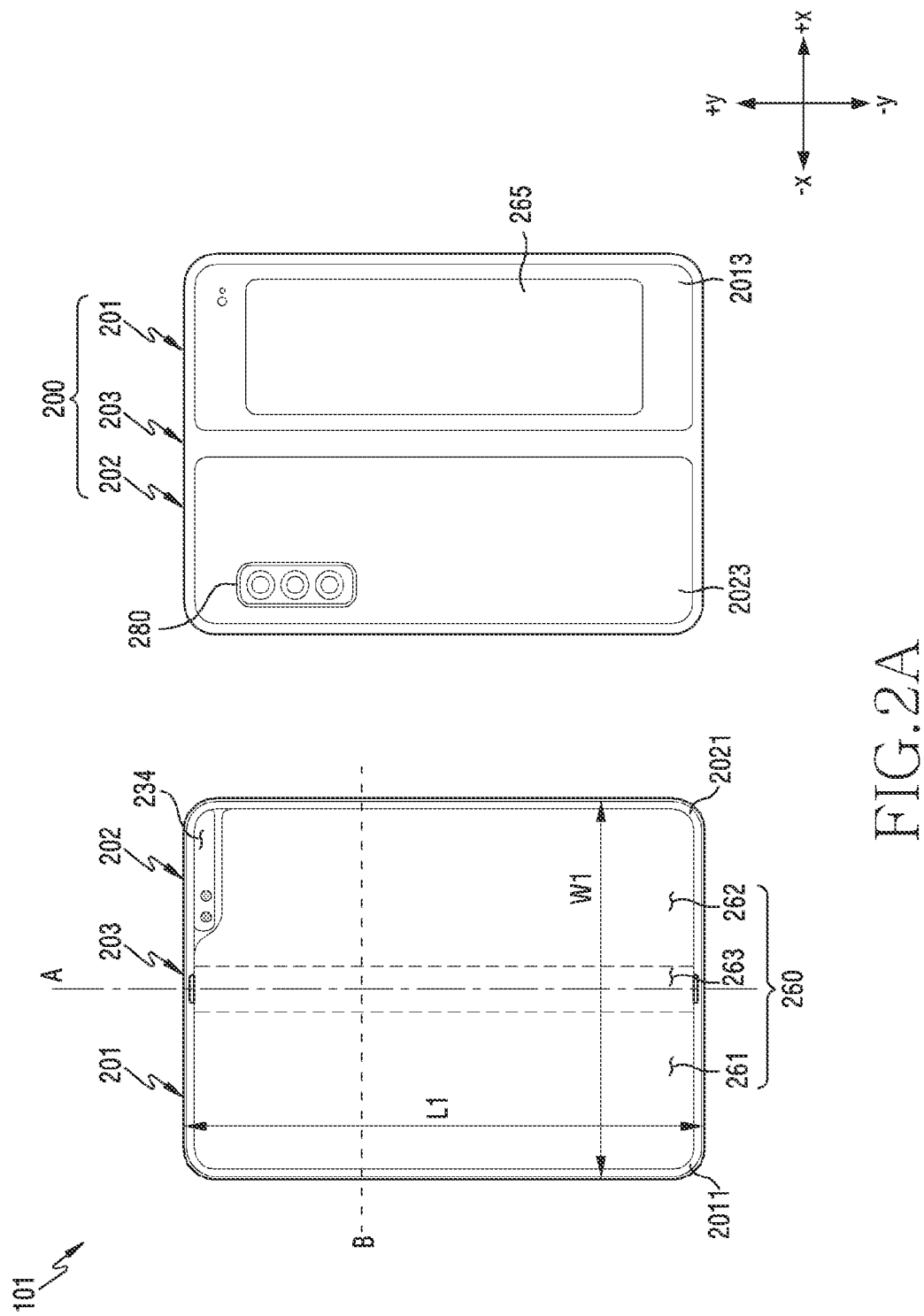
FIG. 2A is a diagram illustrating a foldable electronic device in an unfolded state according to various embodiments.
Figure 2B:
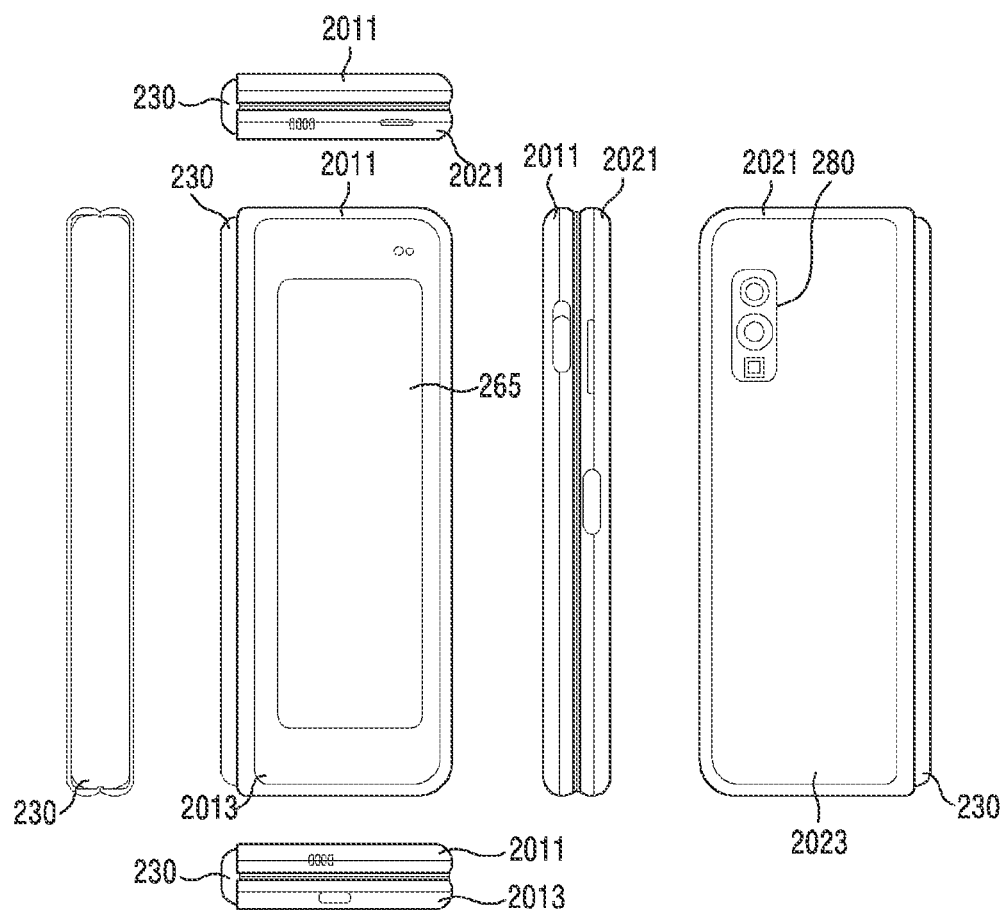
FIG. 2B is a diagram illustrating a foldable electronic device in a folded state according to various embodiments.

FIG. 2A is a diagram illustrating a foldable electronic device in an unfolded state according to various embodiments. FIG. 2B is a diagram illustrating a foldable electronic device in a folded state according to various embodiments.

Referring to FIG. 2A and FIG. 2B together, according to an example embodiment, the electronic device 101 may include a foldable housing 200 (hereinafter, abbreviated as "housing" 200) and a flexible or foldable display 260 (hereinafter, abbreviated as "display" 260) which is disposed in a space formed by the housing 200. In the disclosure, a surface on which the display 260 is disposed may be referred to as a first surface, or a front surface of the electronic device 101. And, a surface opposite to the front surface may be referred to as a second surface, or a rear surface of the electronic device 101. Also, a surface surrounding a space between the front surface and the rear surface may be referred to as a third surface, or a side surface of the electronic device 101.

In an embodiment, the housing 200 may have a substantially rectangular shape in the unfolded state of FIG. 2A. For example, the housing 200 may have a specified width (W1) and a specified length (L1) longer than the specified width (W1). For another example, the housing 200 may have a specified width (W1) and a specified length (L1) that is substantially equal to or shorter than the specified width (W1). For example, the specified width (W1) may be a width of the display 260. In an embodiment, the housing 200 of the electronic device 101 can be folded or unfolded with a criterion of a folding axis (A) which is substantially in parallel to a long edge of the rectangle (e.g., an edge going in a y-axis direction among edges of the housing 200 of the electronic device 101 in FIG. 2A).

In an embodiment, the housing 200 may include a first housing 201, a second housing 202, and a connecting part 203. The connecting part 203 may be disposed between the first housing 201 and the second housing 202. The connecting part 203 may be coupled to the first housing 201 and the second housing 202, and the first housing 201 and/or the second housing 202 may be rotated centering on the connecting part 203 (or the folding axis (A)).

In an embodiment, the first housing 201 may include a first side member 2011 and a first rear cover 2013. In an embodiment, the second housing 202 may include a second side member 2021 and a second rear cover 2023.

In an embodiment, the first side member 2011 may extend along an edge of the first housing 201, and may form at least one portion of a side surface of the electronic device 101. The first side member 2011 may include at least one conductive portion formed of a conductive material (e.g., a metal). The conductive portion may operate as an antenna radiator for transmitting and/or receiving an RF signal. Similarly to the first side member 2011, the second side member 2021 may form one portion of a side surface of the electronic device 101, and at least one portion of the second side member 2021 may be formed of a conductive material and operate as an antenna radiator.

In an embodiment, the first side member 2011 and the second side member 2021 may be disposed at both sides centering on the folding axis (A), and may have a substantially symmetrical shape with respect to the folding axis (A).

In an embodiment, an angle or distance between the first side member 2011 and the second side member 2021 may be varied depending on whether the electronic device 101 is in an unfolded state, a folded state, or an intermediate state.

In an embodiment, the housing 200 may form a recess for receiving the display 260. The recess may correspond to a shape of the display 260.

In an embodiment, a sensor region 234 may be formed to have a predetermined (e.g., specified) region in adjacent to one corner of the second housing 202. However, the arrangement, shape, and size of the sensor region 234 are not limited to the illustrated example. For example, in an embodiment, the sensor region 234 may be presented to another corner of the housing 200 or any region between upper and lower corners. For another example, the sensor region 234 may be omitted too. For example, components disposed in the sensor region 234 may be disposed under the display 260 or be disposed in other locations of the housing 200. In an embodiment, components for performing various functions embedded in the electronic device 101 may be exposed to the front surface of the electronic device 101, through the sensor region 234, or through one or more openings prepared in the sensor region 234. In various embodiments, the components may include various types of sensors. The sensor may include, for example, at least one of a front camera, a receiver, and a proximity sensor.

In an embodiment, the first rear cover 2013 may be disposed in the first housing 201 on a rear surface of the electronic device 101. The first rear cover 2013 may have a substantially rectangular edge. Similarly to the first rear cover 2013, the second rear cover 2023 may be disposed in the second housing 202 on the rear surface of the electronic device 101.

In an embodiment, the first rear cover 2013 and the second rear cover 2023 may have a substantially symmetrical shape centering on the folding axis (A). However, the first rear cover 2013 and the second rear cover 2023 do not necessarily have a mutually symmetrical shape, and in an embodiment, the electronic device 101 may include the first rear cover 2013 and/or the second rear cover 2023 having various shapes. In an embodiment, the first rear cover 2013 may be formed integrally with the first side member 2011, and the second rear cover 2023 may be formed integrally with the second side member 2021.

In an embodiment, the first rear cover 2013, the second rear cover 2023, the first side member 2011, and the second side member 2021 may form a space in which various components (e.g., a printed circuit board or a battery) of the electronic device 101 may be disposed.

In an embodiment, one or more components may be disposed or be visually exposed on the rear surface of the electronic device 101. For example, at least a part of a sub-display 265 may be visually exposed through at least one region of the first rear cover 2013. For example, the sub-display 265 may be visually exposed (e.g., visible) through the entire region of the first rear cover 2013, but a region where the sub-display 265 is exposed is not limited to the above-described example. For another example, a rear camera 280 may be visually exposed through at least one region of the second rear cover 2023. For further example, the rear camera 280 may be disposed in one region of the rear surface of the electronic device 101.

The housing 200 of the electronic device 101 is not limited to a form and coupling illustrated in FIGS. 2A and 2B, and may be implemented by a combination and/or coupling of other shapes or parts.

Referring to FIG. 2B, the connecting part 203 may be implemented wherein the first housing 201 and the second housing 202 are mutually rotatable. For example, the connecting part 203 may include a hinge structure coupled to the first housing 201 and the second housing 202. In an embodiment, the connecting part 203 may be disposed between the first side member 2011 and the second side member 2021, and include a hinge cover 230 for covering an internal component (e.g., the hinge structure). In an embodiment, the hinge cover 230 may be covered by a part of the first side member 2011 and the second side member 2021, or be exposed to the outside, according to a state (i.e., a flat state or a folded state) of the electronic device 101. For example, a size of a region of the hinge cover 230 exposed to the outside may be changed according to the state (i.e., the flat state or the folded state) of the electronic device 101.

For example, as shown in FIG. 2A, when the electronic device 101 is in a flat state (e.g., fully unfolded state), at least a part of the hinge cover 130 may not exposed because being covered with the first side member 2011 and the second side member 2021. For example, as shown in FIG. 2B, when the electronic device 101 is in a folded state, the hinge cover 230 may be exposed externally between the first side member 2011 and the second side member 2021. For example, when the first side member 2011 and the second side member 2021 are in an intermediate state of being folded at a certain angle, a part of the hinge cover 230 may be partially exposed externally between the first side member 2011 and the second side member 2021. However, in this case, an exposed area of the hinge cover 230 may be smaller than a fully folded state of FIG. 2B.

In an embodiment, the display 260 may be disposed in a space formed by the housing 200. For example, the display 260 may be seated in a recess formed by the housing 200, and may form most of a front surface of the electronic device 101. For example, the front surface of the electronic device 101 may include the display 260, and a partial region of the first side member 2011 and a partial region of the second side member 2021 which are adjacent to the display 260. For another example, a rear surface of the electronic device 101 may include the first rear cover 2013, a partial region of the first side member 2011 adjacent to the first rear cover 2013, the second rear cover 2023, and a partial region of the second side member 2021 adjacent to the second rear cover 2023.

In an embodiment, the display 260 may include a flexible display of which at least a partial region can be deformed into a flat surface or a curved surface. In an embodiment, the display 260 may include a folding region 263, a first region 261, and a second region 262. The folding region 263 may extend along the folding axis (A), and the first region 261 may be disposed at one side (e.g., a left side of the folding region 263 shown in FIG. 2A) with respect to the folding region 263, and the second region 262 may be disposed at the other side (e.g., a right side of the folding region 263 shown in FIG. 2A). For another example, the first region 261 may be a region disposed in the first housing 201, and the second region 262 may be a region disposed in the second housing 202. The folding region 263 may be a region disposed in the connecting part 203.

The division of the regions of the display 260 shown in FIG. 2A and FIG. 2B is merely a non-limiting example, and the display 260 may be divided into a plurality (e.g., four or more or two) regions according to a structure or function. For example, in an embodiment shown in FIG. 2A, the regions of the display 260 may be divided by the folding region 263 or the folding axis (A), but in an embodiment, the regions of the display 260 may be divided with a criterion of another folding region or another folding axis, too.

In an embodiment, the first region 261 and the second region 262 may have the entirely symmetrical shape centering on the folding region 263. However, unlike the first region 261, the second region 262 may include a notch which is cut according to the existence of the sensor region 234 but other regions may have a shape symmetric to that of the first region 261. For example, the first region 261 and the second region 262 may include a portion having a mutually symmetric shape and a portion having a mutually asymmetric shape.

Hereinafter, example operations of the first side member 2011 and the second side member 2021 dependent on the state (e.g., the flat state and the folded state) of the electronic device 101, and each region of the display 260, will be described in greater detail with reference to the drawings.

In an embodiment, when the electronic device 101 is in the unfolded state (e.g., FIG. 2A), the first side member 2011 and the second side member 2021 may be arranged to form an angle of about 180 degrees and face the substantially same direction. A surface of the first region 261 of the display 260 and a surface of the second region 262 may form about 180 degrees with each other and may face the substantially same direction (e.g., a front direction of the electronic device). For example, the folding region 263 may form the same plane as the first region 261 and the second region 262.

In an embodiment, when the electronic device 101 is in a folded state (e.g., FIG. 2B), the first side member 2011 and the second side member 2021 may be disposed to face each other. The surface of the first region 261 of the display 260 and the surface of the second region 262 may form a narrow angle (e.g., between 0 degree and 10 degrees) while facing each other. At least a part of the folding region 263 may be formed of a curved surface having a predetermined curvature.

In an embodiment, when the electronic device 101 is in an intermediate state, the first side member 2011 and the second side member 2021 may be disposed mutually at a certain angle. The surface of the first region 261 of the display 260 and the surface of the second region 262 may form an angle which is greater than that in the folded state and is less than that of the unfolded state. At least a part of the folding region 263 may be formed of a curved surface having a certain curvature, and the curvature at this time may be smaller than that in the folded state.

Figure 3:
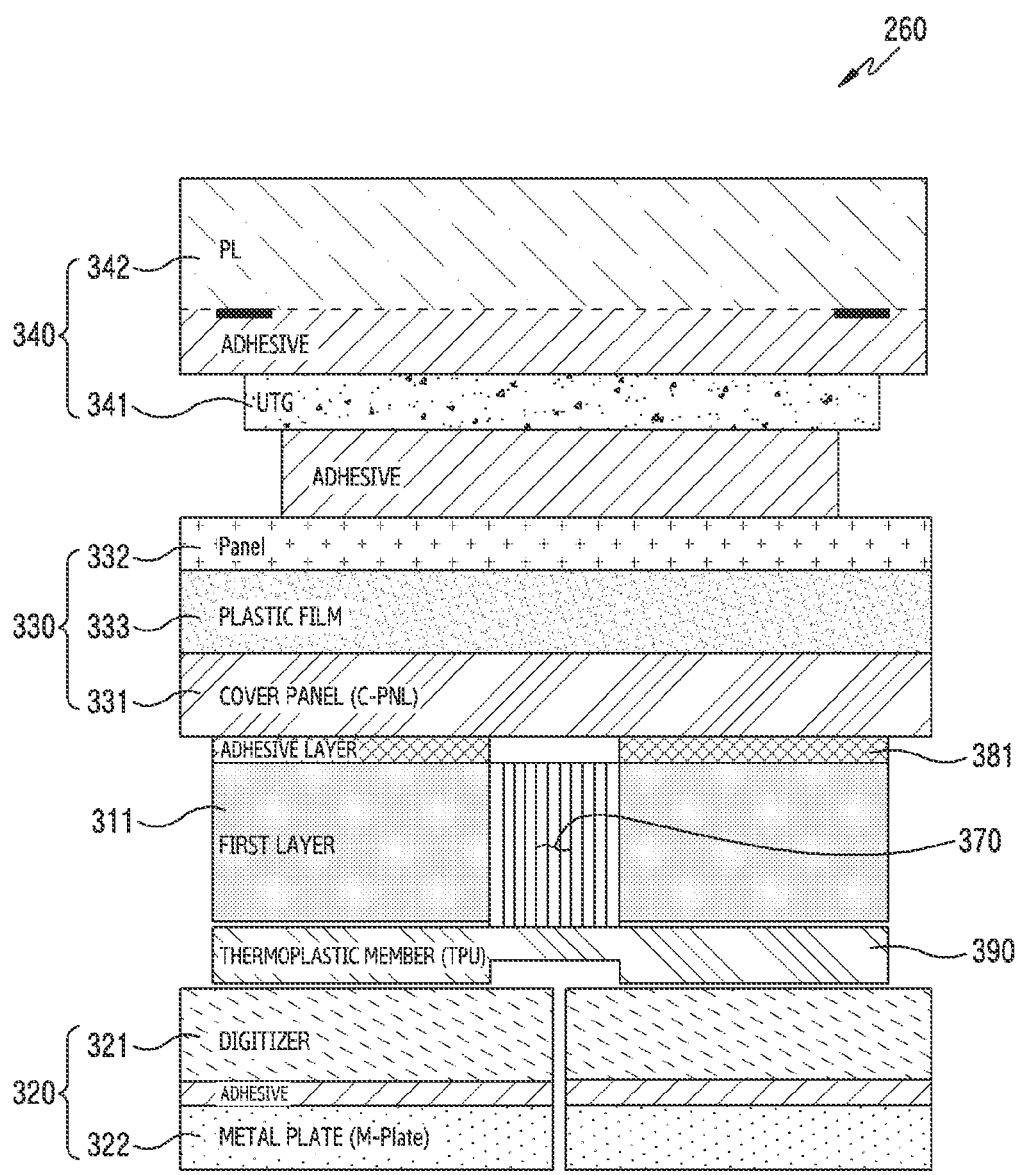
FIG. 3 is a cross-sectional view of a display taken along axis B of FIG. 2A according to various embodiments.

FIG. 3 is a cross-sectional view of a display taken along axis B of FIG. 2A according to various embodiments.

Referring to FIG. 3, the display 260 (or a display structure) according to an embodiment may include a plurality of layers. According to an embodiment, the display 260 may include a cover glass 340, a display panel 330 disposed adjacent to one surface of the cover glass 340, a first layer 311 disposed under the display panel 330, and a second layer 320 disposed under the first layer 311. According to an embodiment (not shown), some (e.g., a thermoplastic member 390) of the above-described constructions may be omitted, and other constructions may be added.

According to an embodiment, the display 260 may include an adhesive (e.g., a pressure sensitive adhesive (PSA)) for bonding the plurality of layers described above. According to an embodiment, the adhesive may include an optically clear adhesive (OCA), a heat-responsive adhesive, a double-sided tape, or the like, besides the PSA, but is not limited thereto.

According to an embodiment, the cover glass 340 may include a film layer 342 and a transparent plate 341 (e.g., an ultra-thin glass (UTG)) which are at least partially exposed through a front surface of the electronic device 101. The film layer 342 and the transparent plate 341 of an embodiment may be coupled by an adhesive. According to an embodiment, the film layer 342 and the transparent plate 341 may have ductility and may be folded or bent. For example, the film layer 342 may be referred to as a polarization film, but is not limited thereto.

According to an embodiment, the display panel 330 may include a panel 332, a plastic film 333 disposed beneath the panel 332, and a cover panel 331 disposed beneath the plastic film 333. According to an embodiment, the plastic film 333 may include an adhesive (e.g., PSA) and attach the panel 332 and the cover panel 331. According to an embodiment, the plastic film 333 may be referred to as a polarization film.

According to an embodiment, the panel 332 may be implemented as a touch panel having electrodes for receiving a touch input, a fingerprint recognition, or a pen input. According to an embodiment, the panel 332 may include, for example, and without limitation, an organic light emitting diode (OLED) panel, a liquid crystal display (LCD), a quantum dot light-emitting diode (QLED) panel, or the like. For example, the display panel 330 may include a plurality of pixels for displaying an image, and one pixel may include a plurality of sub-pixels. For example, one pixel may include three colors of red sub-pixel, green sub-pixel, and blue sub-pixel. For another example, one pixel may be formed in an RGBG pentile scheme including one red sub-pixel, two green sub-pixels, and one blue sub-pixel.

According to an embodiment, the display 260 may include the first layer 311 disposed under the display panel 330. According to an embodiment, an adhesive layer 381 may be disposed between the display panel 330 and the first layer 311, whereby the first layer 311 may be attached under the display panel 330. According to an embodiment, the adhesive layer 381 may be disposed wherein a shape of the adhesive layer 381 corresponds to a shape of the first layer 311, or an edge of the adhesive layer 381 corresponds to an edge of the first layer 311.

According to an embodiment, since the first layer 311 has rigidity, the flexible display 260 may secure rigidity. According to an embodiment, the first layer 311 may be formed of a lightweight material for the sake of the lightweight of the display 260. According to an embodiment, the first layer 311 may include a dielectric material having a permittivity which is greater than or is equal to a specified value. For example, the first layer 311 may be formed of a carbon reinforced fiber plastic (CRFP) having a permittivity of about 200, but is not limited thereto.

According to an embodiment, the first layer 311 may include a lattice pattern 370 in at least a partial region. For example, the first layer 311 may include the lattice pattern 370 in a region adjacent to a folding axis (e.g., the folding axis (A) of FIG. 2A). According to an embodiment, since the first layer 311 includes the lattice pattern 370 in the region adjacent to the folding axis, when the electronic device 101 is switched to a folded state (e.g., FIG. 2B) or an unfolded state (e.g., FIG. 2A), the first layer 311 and a plurality of layers attached to the first layer 311 may also be folded or unfolded according to each state.

According to an embodiment, an edge of the first layer 311 may be formed inwardly compared to an edge of the display panel 330 or the second layer 320, when viewed in a direction perpendicular to a front surface of the electronic device 101. A more detailed description thereof will be provided later.

According to an embodiment, the display 260 may further include a thermoplastic member 390 (e.g., a thermoplastic poly urethane (TPU)) disposed beneath the first layer 311. According to an embodiment, since the display 260 includes the thermoplastic member 390, damage to the display panel 330, the first layer 311, and/or the second layer 320 may be prevented and/or reduced. For example, since the display 260 includes the thermoplastic member 390, bubbles provided between the plurality of layers disposed in the display 260 may be prevented and/or reduced. Also, since the display 260 includes the thermoplastic member 390, foreign substances may be prevented and/or reduced from being introduced between the plurality of layers disposed in the display 260.

According to an embodiment, the display 260 may include the second layer 320 disposed under the first layer 311. According to an embodiment, the second layer 320 may include at least one of a digitizer 321 and a metal plate 322.

For example, the second layer 320 may include the metal plate 322 disposed under the first layer 311.

According to an embodiment, the digitizer 321 and the metal plate 322 may be adhered by an adhesive. For example, the adhesive may be attached to the bottom of the digitizer 321, and the metal plate 322 may be attached to the bottom of the digitizer 321 by the adhesive.

According to an embodiment, the second layer 320 may be formed to be cut in a region corresponding to a folding axis (e.g., the folding axis (A) of FIG. 2A). According to an embodiment, as the second layer 320 is formed to be cut in the region corresponding to the folding axis (e.g., the folding axis (A) of FIG. 2A), when the electronic device 101 is switched to the folded state (e.g., FIG. 2B) or the unfolded state (e.g., FIG. 2A), the second layer 320 may be folded or unfolded according to each state. According to an embodiment (not shown), the second layer 320 may have ductility and may be formed to cross the folding axis.

According to an embodiment, the digitizer 321 may refer to a device capable of obtaining an input for an x-position and/or a y-position, and may detect an input device of magnetic field type (e.g., an electronic pen). For example, at least one processor (e.g., the processor 120 of FIG. 1) may present a current to the digitizer 321, and the digitizer 321 may provide an electromagnetic field. When the electronic pen approaches the electromagnetic field of the digitizer 321, electromagnetic induction may occur and a resonance circuit of the electronic pen may provide a current. The resonance circuit of the electronic pen may form a magnetic field using the provided current. At least one processor may detect a position by scanning a strength of the magnetic field applied from the electronic pen to the digitizer 321 over the entire region. At least one processor may perform an operation that is based on the detected position.

According to an embodiment, the metal plate 322 may be referred to as a shielding layer. According to an embodiment, the metal plate 322 may be formed by coating a lower portion of the digitizer 321 with a magnetic metal powder (MMP). The metal plate 322 of an embodiment may reduce a noise by shielding a magnetic force caused by peripheral electronic components besides a signal input from the electronic pen.

Figure 4:
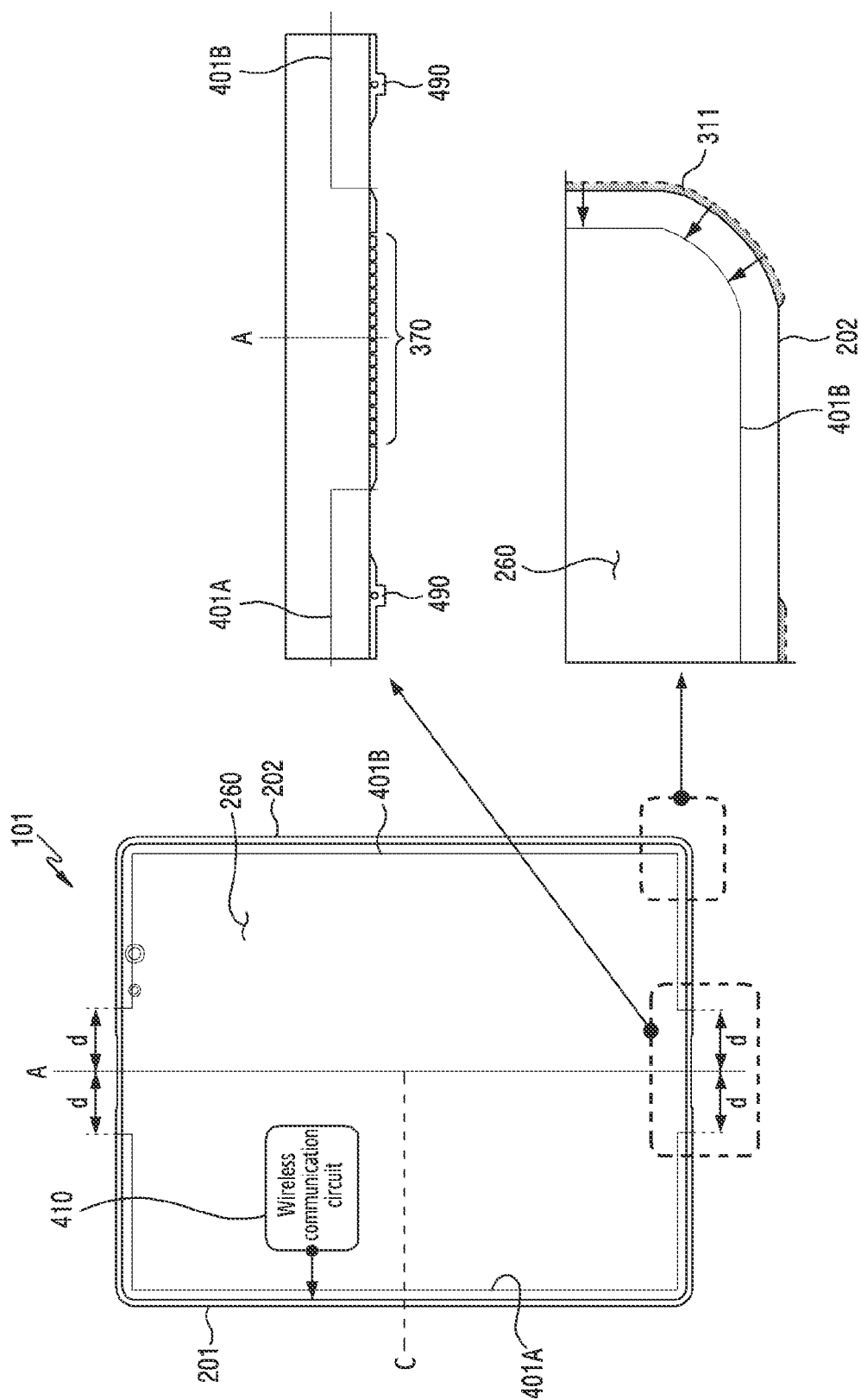
FIG. 4 is a diagram illustrating a first edge of a first layer reduced as much as a specified distance from a side surface of an electronic device according to various embodiments.

FIG. 4 is a diagram illustrating a first edge of a first layer reduced as much as a specified distance from a side surface of an electronic device according to various embodiments.

Referring to FIG. 4, the electronic device 101 of an embodiment may include a first layer (e.g., the first layer 311 of FIG. 3) having first edges 401A and 401B formed inside an edge of the housing 200, and a wireless communication circuit 410 disposed within the housing 200. According to an embodiment, the first edge of the first layer may be formed to be inwardly spaced a predetermined (e.g., specified) distance (e.g., about 1 mm) apart from a side surface of the electronic device 101.

According to an embodiment, the wireless communication circuit 410 may be electrically connected to at least a part of the housing 200. According to an embodiment, the wireless communication circuit 410 may feed to at least a partial region of the housing 200, thereby transmitting and/or receiving a signal of a specified frequency band. For example, the wireless communication circuit 410 may feed to a partial region of the first housing 201, thereby transmitting and/or receiving a signal of a frequency band of about 6 GHz.

According to an embodiment, the first layer 311 may include the first edges 401A and 401B formed inside from the side surface of the electronic device formed by the housing 200. According to an embodiment, the first layer 311 may include the 1-1st edge 401A inwardly spaced a predetermined (e.g., specified) distance (e.g., 1 mm) apart from a side surface formed by the first housing 201 (or the first side member 2011 of FIG. 2B). The first layer 311 may include the 1-2nd edge 401B inwardly spaced a predetermined (e.g., specified) distance (e.g., 1 mm) from the side surface formed by the second housing 202 (or the second side member 2021 of FIG. 2B). According to an embodiment, the 1-1st edge 401A and the 1-2nd edge 401B may be formed to correspond to an edge of the electronic device 101 formed by the housing 200. A more detailed description thereof will be provided later.

According to an embodiment, the 1-1st edge 401A and the 1-2nd edge 401B may be each formed to be spaced a specified distance (d) (e.g., 5.5 mm) or more apart from the folding axis (A).

According to an embodiment, the first layer 311 may include a lattice pattern 370 in at least a partial region. According to an embodiment, the first layer 311 may include the lattice pattern 370 in at least a partial region adjacent to the folding axis (A).

According to an embodiment, the lattice pattern 370 may include a plurality of bars. According to an embodiment, the first layer 311 may be folded or unfolded with a criterion of the folding axis (A) as the lattice pattern 370 including the plurality of bars is included in the at least partial region.

According to an embodiment, the display 260 may include an alignment mark 490 extending from a second layer (e.g., the second layer 320 of FIG. 3). According to an embodiment, the alignment mark 490 extending from the second layer may be formed in a corresponding position with a criterion of the folding axis (A).

According to an embodiment, the 1-2nd edge 401B of the first layer 311 may have a shape corresponding to an edge of the display 260. According to an embodiment, the 1-2nd edge 401B of the first layer 311 may be formed to be inwardly spaced a predetermined (e.g., specified) distance (e.g., about 1 mm) or more apart from the edge of the display 260. The 1-2nd edge 401B of the first layer 311 may be formed to be inwardly spaced a predetermined (e.g., specified) distance (e.g., about 1 mm) or more apart from the outermost edge of the display 260.

Figure 5A:
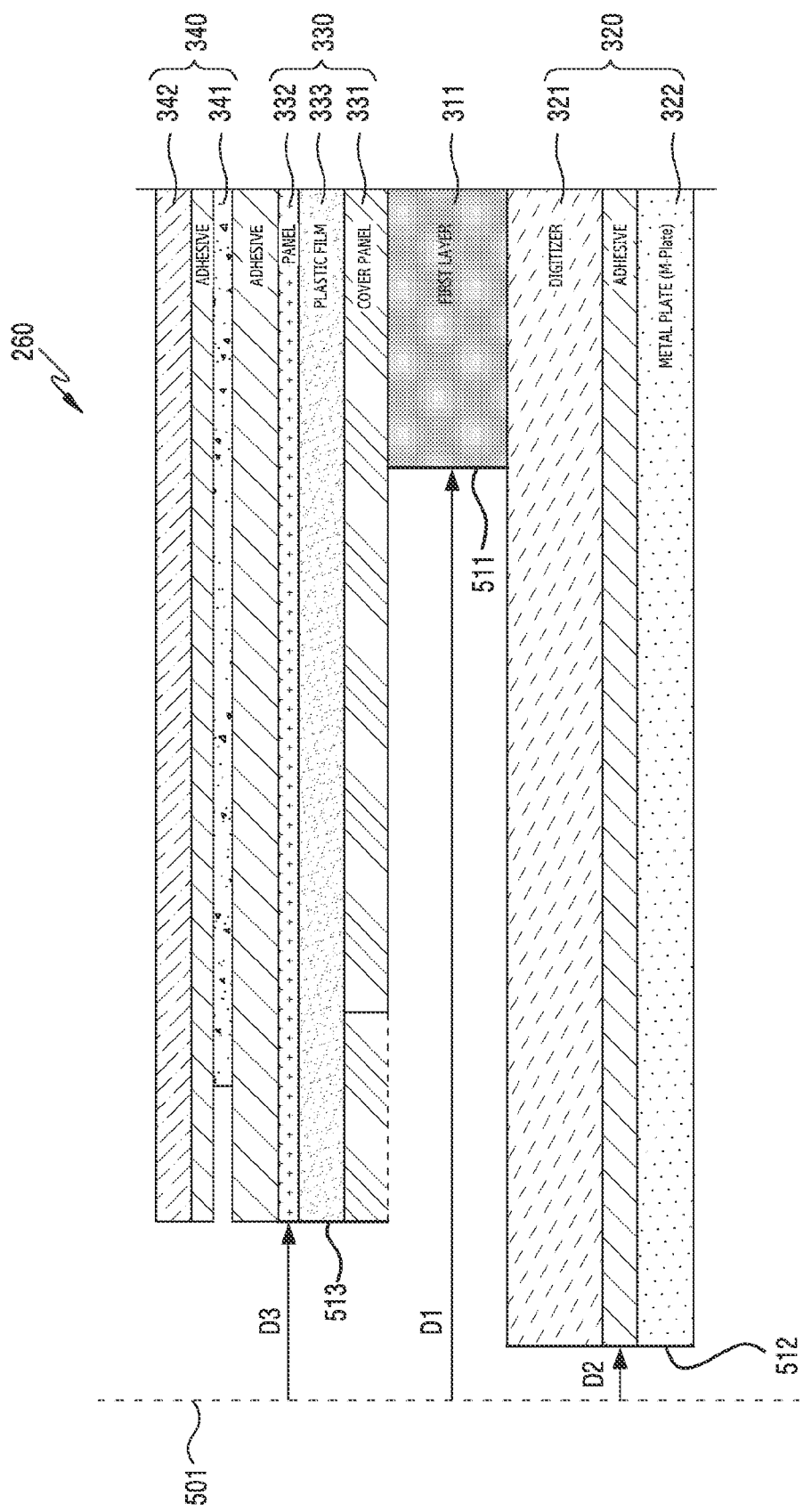
FIG. 5A is a cross-sectional view of a display structure taken along axis C of FIG. 4 according to various embodiments.
Figure 5B:
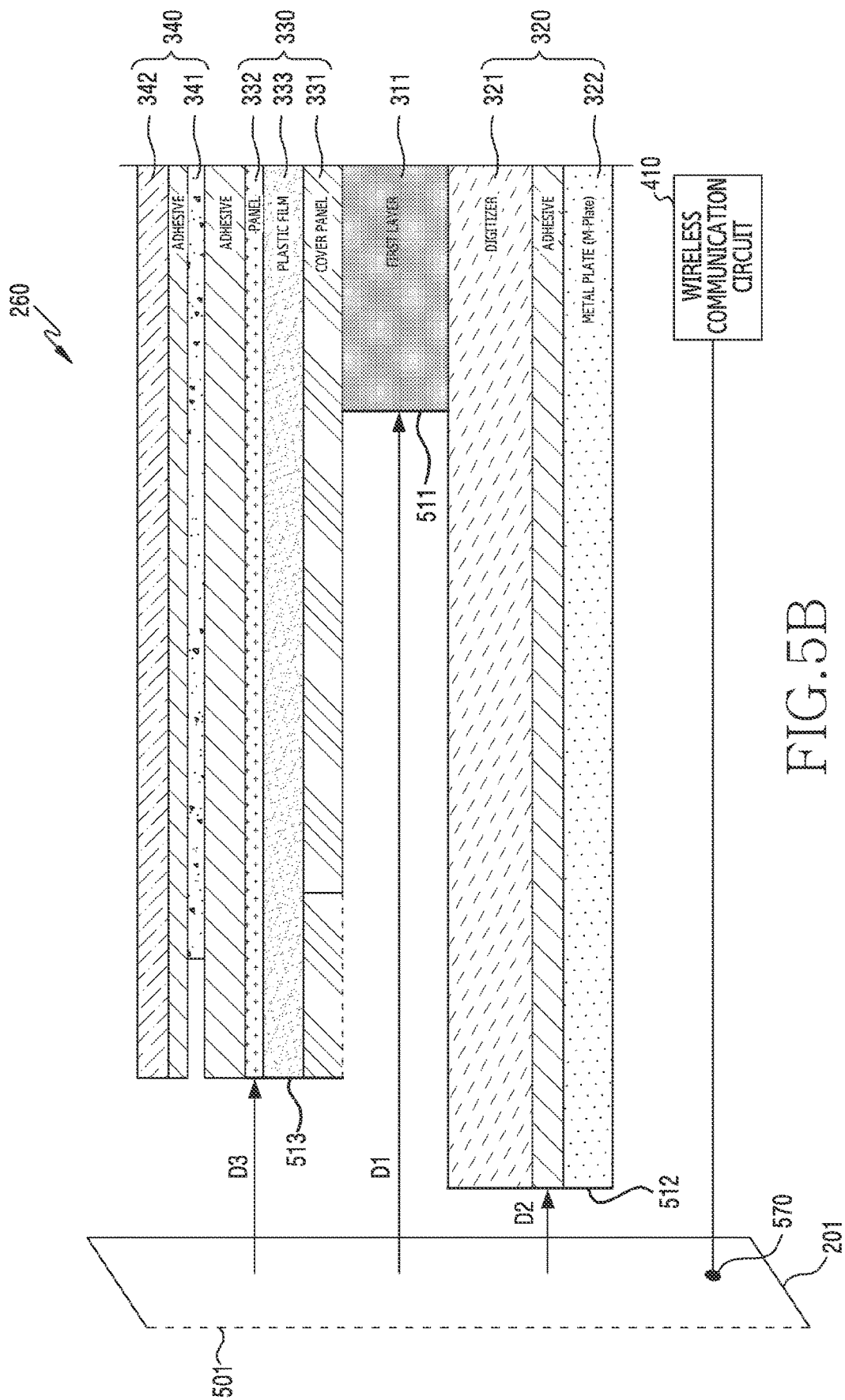
FIG. 5B is a cross-sectional view of the display structure of FIG. 5A including a wireless communication circuit according to various embodiments.

FIG. 5A is a cross-sectional view of a display structure taken along axis C of FIG. 4 according to various embodiments. FIG. 5B illustrates the display structure of FIG. 5A including a wireless communication circuit according to various embodiments.

Referring to FIG. 5A and FIG. 5B together, the display 260 of an embodiment may include a plurality of layers, and the plurality of layers may be disposed to be each spaced a predetermined (e.g., specified) distance apart from a first side surface 501 of the electronic device 101 (e.g., the side surface of the electronic device 101 of FIG. 2A).

According to an embodiment, the display 260 may include the cover glass 340 forming at least a part of a front surface of the electronic device, the display panel 330 disposed in adjacent to one surface of the cover glass 340, the first layer 311 disposed beneath the display panel 330, and the second layer 320 disposed beneath the first layer 311. The same or substantially same construction as the above-described construction is denoted by the same reference numeral, and a duplicate description may not be repeated.

According to an embodiment, the first side surface 501 may be referred to as a side surface of the electronic device formed by the first housing (e.g., the first housing 201 of FIG. 2A). According to an embodiment, the first layer 311 may include a first edge 511 (e.g., the first edges 401A and 401B of FIG. 4) that is spaced a first distance (D1) apart from the first side surface 501. For example, the first edge 511 of the first layer 311 may be spaced a predetermined (e.g., specified) distance (e.g., about 1 mm) apart from the first side surface 501. According to an embodiment, as the first edge 511 is spaced the first distance (D1) apart from the first side surface 501, the first edge 511 may be spaced a predetermined (e.g., specified) distance or more apart from at least a part of the first housing 201.

According to an embodiment, the second layer 320 may include a second edge 512 that is spaced apart from the first side surface 501 by a second distance (D2) that is less than the first distance (D1). For example, the second edge 512 of the second layer 320 may be spaced a predetermined (e.g., specified) distance (e.g., about 0.2 mm) apart from the first side surface 501, but is not limited thereto.

According to an embodiment, the display panel 330 may include an edge 513 that is spaced apart from the first side surface 501 by a third distance (D3) that is less than the first distance (D1) and is greater than the second distance (D2). For example, the edge 513 of the display panel 330 may be spaced about 0.4 mm apart from the first side 501, but is not limited thereto. According to an embodiment, an edge of the cover panel 331 may be formed to be spaced apart from the first side surface 501 by a distance greater than the third distance (D3), but is not limited thereto.

According to an embodiment, at least a part of the first edge 511 of the first layer 311 may be formed at an inner side of the edge 513 of the display panel 330. According to an embodiment, at least a part of the second edge 512 of the second layer 320 may be formed at an outer side of the edge 513 of the display panel 330.

According to an embodiment, the second edge 512 of the second layer 320 may form the outermost edge of the display 260. According to an embodiment, the first edge 511 of the first layer 311 may form the innermost edge of the display 260.

Referring to FIG. 5B, the wireless communication circuit 410 of an embodiment may feed to one point 570 among the first housing 201, thereby transmitting and/or receiving a signal of a specified frequency band.

According to an embodiment, the first edge 511 of the first layer 311 may be formed in a region corresponding to a region fed from the wireless communication circuit 410 among the first housing 201.

According to an embodiment, the first edge 511 of the first layer 311 may be formed to be spaced a first distance (D1) apart from the region fed from the wireless communication circuit 410 among the first housing 201. According to an embodiment, the first edge 511 may be formed to be spaced a predetermined distance (e.g., 1 mm) or more apart from the region fed from the wireless communication circuit 410 among the first housing 201, thereby improving the radiation performance of a signal transmitted and/or received through the first housing 201. For example, the first edge 511 of the first layer 311 having a permittivity of 150 or more may be formed to be spaced about 1 mm or more apart from the region fed from the wireless communication circuit 410 among the first housing 201, thereby improving the degradation of the radiation performance of a signal transmitted and/or received through the first housing 201.

According to an embodiment (not shown), the first housing 201 and the first side surface 501 of FIG. 5B may be referred to as the second housing 202 corresponding to the first housing 201 and the second side surface formed by the second housing 202.

Figure 6:
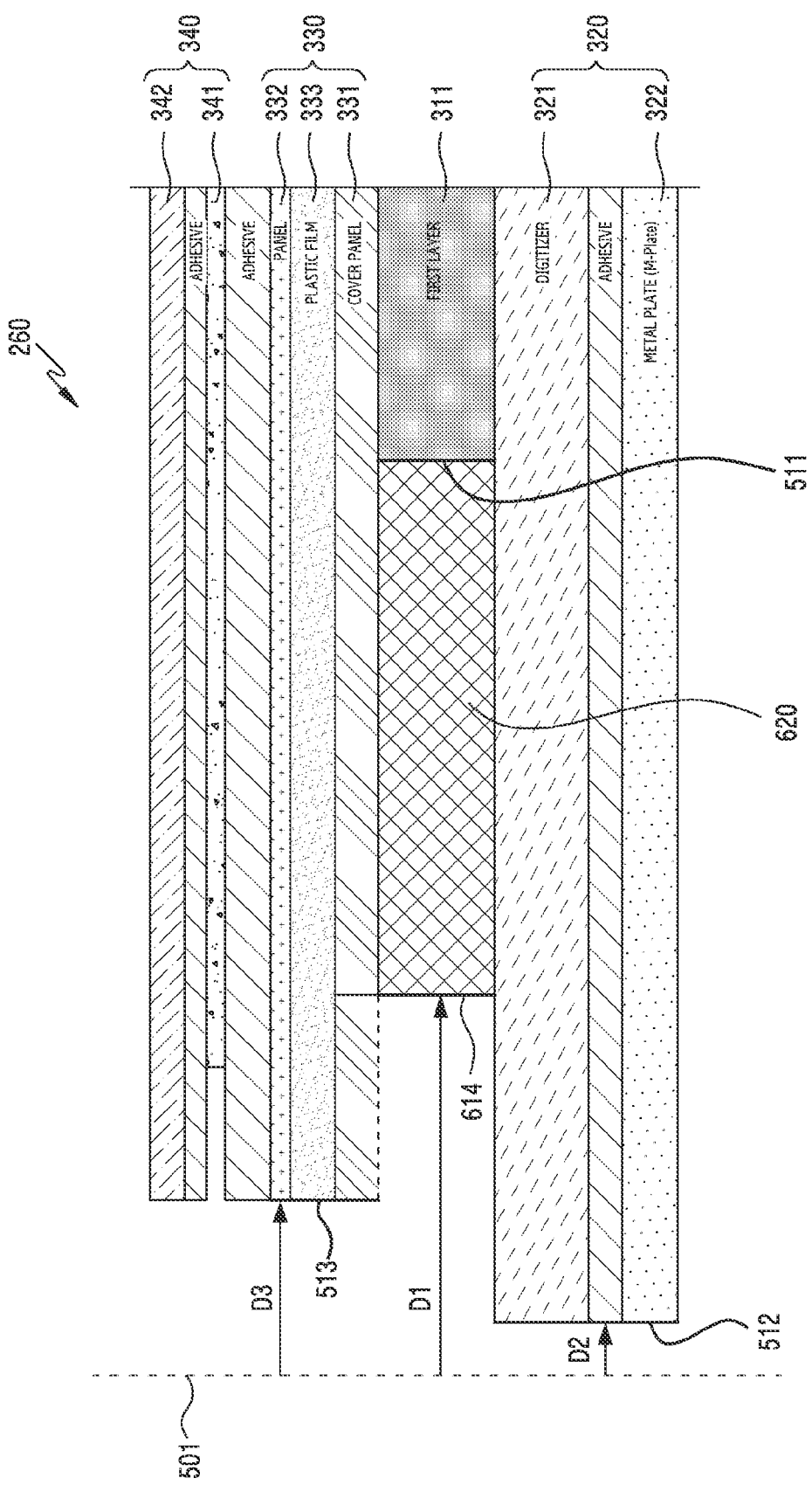
FIG. 6 is a cross-sectional view of a display structure taken along axis C of FIG. 4 according to various embodiments.

FIG. 6 is a cross-sectional view of a display structure taken along axis C of FIG. 4 according to various embodiments.

Referring to FIG. 6, the display 260 of an embodiment may include the cover glass 340 forming at least a part of the front surface of the electronic device 101, the display panel 330 disposed adjacent to one surface of the cover glass 340, the first layer 311 disposed beneath the display panel 330, and the second layer 320 disposed beneath the first layer 311. The same or substantially same construction as the above-described construction is denoted by the same reference numeral, and a duplicate description may not be repeated.

According to an embodiment, the display 260 may include a dielectric layer 620 extending from the first edge 511 of the first layer 311. According to an embodiment, the display 260 may include the dielectric layer 620 including an edge 614 which is extended from the first edge 511 of the first layer 311 and is spaced a first distance (D1) apart from the first side surface 501.

According to an embodiment, the dielectric layer 620 may include a dielectric material having a permittivity less than or equal to a specified value. According to an embodiment, the dielectric layer 620 may be formed of a dielectric material having a permittivity of about 6 or less, but is not limited thereto. For example, the dielectric layer 602 may include a resin having a permittivity of about 2.54.

According to an embodiment, at least a part of the edge 614 of the dielectric layer 620 may be spaced the first distance (D1) apart from the first side surface 501. According to an embodiment (not shown), at least a part of the edge 614 of the dielectric layer 620 may be formed to be spaced apart from the first side surface 501 by a distance (e.g., the third distance (D3)) smaller than the first distance (D1).

According to an embodiment, the edge 614 of the dielectric layer 620 may be formed at an inner side of the edge 513 of the display panel 330. According to an embodiment (not shown), the edge 614 of the dielectric layer 620 may be formed at an outer side of the edge 513 of the display panel 330 and at an inner side of the second edge 512 of the second layer 320.

According to an embodiment, the second edge 512 of the second layer 320 may form the outermost edge of the display 260. According to an embodiment, the edge 614 of the dielectric layer 620 may form the innermost edge of the display 260.

Figure 7A:
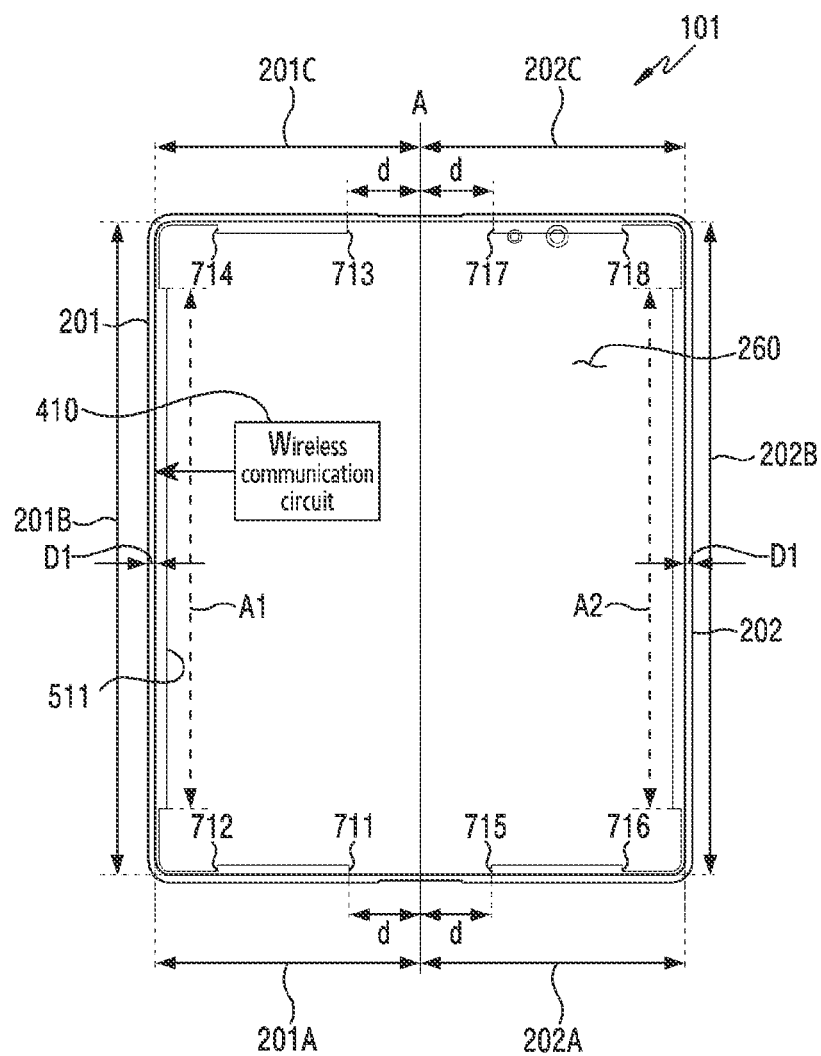
FIG. 7A is a diagram illustrating a first edge of a first layer formed in a region corresponding to at least a partial region of a housing according to various embodiments.
Figure 7B:
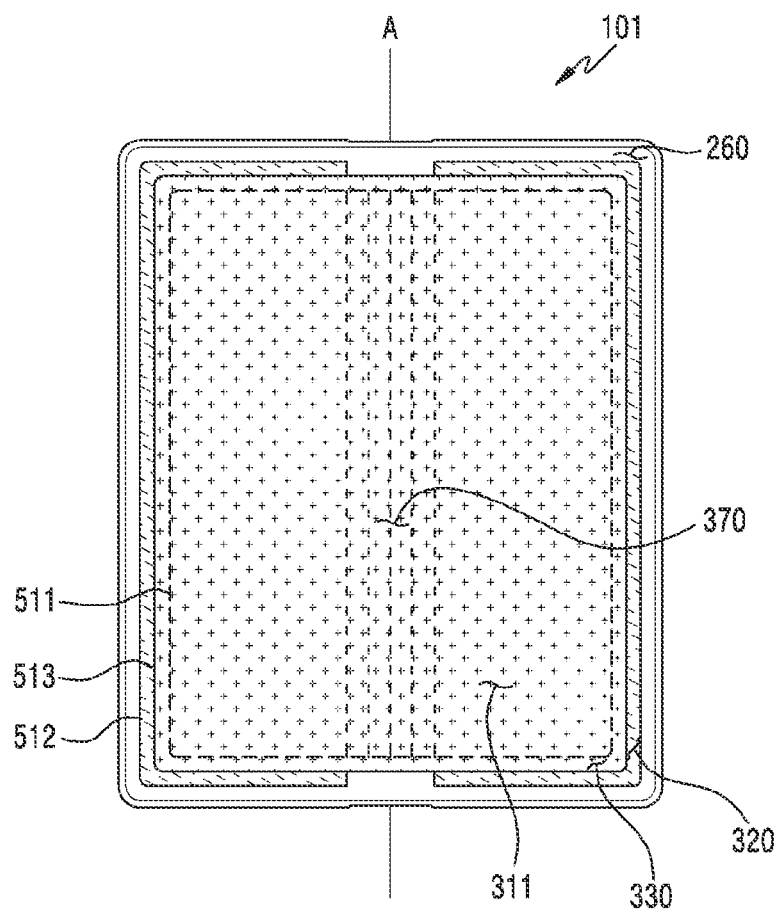
FIG. 7B is a diagram illustrating a display structure when viewed from a direction perpendicular to a front surface of an electronic device according to various embodiments.

FIG. 7A is a diagram illustrating a first edge of a first layer formed in a region corresponding to at least a partial region of a housing according to various embodiments. FIG. 7B is a diagram illustrating a display structure when viewed from a direction perpendicular to a front surface of the electronic device according to various embodiments.

Referring to FIG. 7A and FIG. 7B together, the first layer (e.g., the first layer 311 of FIG. 5A) of an embodiment may include the first edge 511 formed in a region corresponding to at least a partial region of an edge of the housing 200.

Referring to FIG. 7A, the first housing 201 of an embodiment may include a first portion 201A, a second portion 201B extending substantially vertically from the first portion 201A, and a third portion 201C extending substantially vertically from the second portion 201B and being substantially in parallel to the first portion 201A.

According to an embodiment, the second housing 202 may include a fourth portion 202A, a fifth portion 202B extending substantially vertically from the fourth portion 202A, and a sixth portion 202C extending substantially vertically from the fifth portion 202B and being substantially in parallel to the fourth portion 202A.

According to an embodiment, the first edge 511 may be formed in a region corresponding to at least a partial region of the first portion 201A and/or third portion 201C of the first housing 201. According to an embodiment, the first edge 511 may be formed, from a first point 711 spaced a predetermined (e.g., specified) distance (d) apart from the folding axis (A) on the first portion 201A of the first housing 201, to a second point 712 on the first portion 201A. According to an embodiment, the first edge 511 may be formed, from a third point 713 spaced a predetermined (e.g., specified) distance (d) apart from the folding axis (A) on the third portion 201c of the first housing 201, to a fourth point 714 on the third portion 201C.

According to an embodiment, the first edge 511 may be formed in a region corresponding to at least a partial region of the second portion 201B. According to an embodiment, the first edge 511 may be formed to be spaced a specified distance (D1) (e.g., about 1 mm) apart from the side surface of the electronic device 101, in a region (A1) corresponding to a region excluding a corner where the first portion 201A and the second portion 201B of the first housing 201 meet and a corner where the second portion 201B and the third portion 201C meet.

According to an embodiment, the first edge 511 may be formed in a region corresponding to a partial region of the fourth portion 202A and/or the sixth portion 202C of the second housing 202. According to an embodiment, the first edge 511 may be formed, from a fifth point 715 spaced a predetermined (e.g., specified) distance (d) apart from the folding axis (A) on the fourth portion 202A of the second housing 202, to a sixth point 716 on the fourth portion 202A. According to an embodiment, the first edge 511 may be formed, from a seventh point 717 spaced a predetermined (e.g., specified) distance (d) apart from the folding axis (A) on the sixth portion 202C of the second housing 202, to an eighth point 718 on the sixth portion 202C. According to an embodiment, the first edge 511 may be formed in a region corresponding to at least a partial region of a fifth portion 202B. According to an embodiment, the first edge 511 may be formed to be spaced a specified distance apart from the side surface of the electronic device 101, in a region (A2) corresponding to a region excluding a corner where the fourth portion 202A and the fifth portion 202B of the second housing 202 meet and a corner where the fifth portion 202B and the sixth portion 202C meet.

According to an embodiment, the first edge 511 may be formed in a region corresponding to a region fed by a wireless communication circuit (e.g., the wireless communication circuit 410 of FIG. 4) among the first housing 201 and/or the second housing 202. According to an embodiment, the first edge 511 may be formed to be spaced the specified distance (D1) (e.g., 1 mm) apart from the side surface of the electronic device 101, in the region corresponding to the region fed by the wireless communication circuit among the housing 200.

Referring to FIG. 7B, according to an embodiment, when viewed from a direction perpendicular to the front surface of the electronic device 101, the second edge 512 of the second layer 320 and the edge 513 of the display panel 330 may be disposed between the first edge 511 of the first layer 311 and the side surface of the electronic device 101.

According to an embodiment, the first edge 511 of the first layer 311, the second edge 512 of the second layer 320, and the edge 513 of the display panel 330 may be formed in a shape corresponding to an edge of the display 260.

According to an embodiment, the first layer 311 may include the lattice pattern 370 in at least a partial region. According to an embodiment, the first layer 311 may include the lattice pattern 370 in a partial region adjacent to the folding axis (A). According to an embodiment, the first layer 311 may include the lattice pattern 370 in the partial region adjacent to the folding axis (A), whereby the display 260 may be folded or unfolded as the electronic device 101 is switched to a folded state (e.g., FIG. 2B) or an unfolded state (e.g., FIG. 2A).

According to an embodiment, at least a part of the first layer 311 and the display panel 330 may have a shape corresponding to the front surface of the electronic device 101 and may be formed to cross the folding axis (A). According to an embodiment, the second layer 320 may be formed to be segmented with a criterion of the folding axis (A). According to an embodiment (not shown), at least a part of the second layer 320 may be formed to cross the folding axis (A), but is not limited thereto.

An electronic device (e.g., the electronic device 101 of FIG. 1) according to an example embodiment may include: a housing (e.g., the housing 200 of FIG. 2A) including: a first housing (e.g., the first housing 201 of FIG. 2A) including a first side surface of the electronic device, a second housing (e.g., the second housing 202 of FIG. 2A) including a second side surface corresponding to the first side surface, and a hinge (e.g., the connecting part 203 of FIG. 2A) connecting the first housing and the second housing, the electronic device configured to be switchable to a folded (e.g., FIG. 2B) or unfolded state (e.g., FIG. 2A) about the hinge; a wireless communication circuit (e.g., the wireless communication circuit 410 of FIG. 4) disposed inside the housing and configured to transmit and/or receive a signal of a specified frequency by feeding to at least a part of the housing, and a display structure (e.g., the display 260 of FIG. 2A) coupled to the housing. The display structure according to an example embodiment may include: a cover glass (e.g., the cover glass 340 of FIG. 3) coupled to the housing and forming at least a part of a front surface of the electronic device, a display panel (e.g., the display panel 330 of FIG. 3) disposed adjacent to one surface of the cover glass, a first layer (e.g., the first layer 311 of FIG. 3) including a dielectric material disposed under the display panel, and having a first edge (e.g., the first edge 511 of FIG. 5A) spaced apart from the first side surface by a first distance (e.g., D1), and a second layer (e.g., the second layer 320 of FIG. 3) disposed under the first layer, wherein a second edge (e.g., the second edge 512 of FIG. 5A) of the second layer corresponding to the first edge of the first layer is spaced apart from the first side surface by a second distance (e.g., D2) less than the first distance. An edge (e.g., the edge 513 of the display panel of FIG. 5A) of the display panel corresponding to the first edge of the first layer may be spaced apart from the first side surface by a third distance (e.g., D3) greater than the second distance and less than the first distance.

According to an example embodiment, when viewed from a direction perpendicular to a front surface of the electronic device, the second edge and the edge of the display panel may be disposed between the first edge and the first side surface.

According to an example embodiment, the second layer may include at least one of a digitizer and a metal plate.

According to an example embodiment, the first layer may include a carbon fiber reinforced plastic (CFRP).

According to an example embodiment, the first layer may further include a dielectric layer extending from the first edge, and the dielectric layer may have a permittivity of about 6 or less.

According to an example embodiment, the dielectric material may have a permittivity of about 150 or more.

According to an example embodiment, the first edge of the first layer, the second edge of the second layer, and the edge of the display panel may be formed in a region corresponding to a region configured to operate as an antenna radiator by being fed from the wireless communication circuit among the housing.

According to an example embodiment, the first edge of the first layer, the second edge of the second layer, and the edge of the display panel may be formed in a region spaced a specified distance apart from the hinge.

According to an example embodiment, the electronic device may include an adhesive layer disposed between the display panel and the first layer, and the adhesive layer may have an edge corresponding to the first edge of the first layer.

According to an example embodiment, at least a part of the first layer may include a lattice pattern.

An electronic device (e.g., the electronic device 101 of FIG. 1) according to an example embodiment may include: a housing (e.g., the housing 200 of FIG. 2A) including: a first housing (e.g., the first housing 201 of FIG. 2A) including a first side surface of the electronic device, a second housing (e.g., the second housing 202 of FIG. 2A) including a second side surface corresponding to the first side surface, and a hinge (e.g., the connecting part 203 of FIG. 2A) connecting the first housing and the second housing, the electronic device configured to be switchable to a folded or unfolded state about the hinge, and a display structure (e.g., the display 260 of FIG. 2A) coupled to the housing. The display structure may include: a cover glass (e.g., the cover glass 340 of FIG. 3) coupled to the housing and forming at least a part of a front surface of the electronic device, a display panel (e.g., the display panel 330 of FIG. 3) disposed adjacent to one surface of the cover glass, a first layer (e.g., the first layer 311 of FIG. 3) including a dielectric material and disposed under the display panel, wherein a first edge (e.g., the first edge 511 of FIG. 5A) of the first layer is spaced apart from the first side surface by a first distance (e.g., D0, and a second layer (e.g., the second layer 320 of FIG. 3) disposed under the first layer, wherein a second edge (e.g., the second edge 512 of FIG. 5A) of the second layer corresponding to the first edge of the first layer is spaced apart from the first side surface by a second distance (e.g., D2) less than the first distance. An edge (e.g., the edge 513 of the display panel of FIG. 5A) of the display panel corresponding to the first edge of the first layer may be spaced apart from the first side surface by a third distance (e.g., D3) greater than the second distance and less than the first distance.

According to an example embodiment, when viewed from a direction perpendicular to the front surface of the electronic device, a second edge of the second layer and an edge of the display may be formed between the first edge of the first layer and the first side surface.

According to an example embodiment, the electronic device may include a wireless communication circuit electrically connected to at least a part of the housing, and the wireless communication circuit may be configured to transmit and/or receive a signal of a specified frequency band by feeding to at least a part of the housing.

According to an example embodiment, the first housing may include a first portion, a second portion extending vertically from the first portion, and a third portion extending vertically from the second portion and in parallel to the first portion, and the first edge of the first layer, the second edge of the second layer, and the edge of the display panel may be formed in a region corresponding to a region spaced a specified distance apart from the hinge among the first portion.

According to an example embodiment, the electronic device may further include an alignment mark extending from the second layer and formed in a region corresponding to the first portion.

A display structure (e.g., the display 260 of FIG. 2A) according to an example embodiment may include: a cover glass (e.g., the cover glass 340 of FIG. 3) forming a first outer surface of the display structure, a flexible display panel (e.g., the display panel 330 of FIG. 3) disposed under the cover glass, a first layer (e.g., the first layer 311 of FIG. 3) having a first edge (e.g., the first edge 511 of FIG. 5A) at least part of which is formed inside an edge (e.g., the edge 513 of the display panel of FIG. 5A) of the flexible display panel, and is disposed under the flexible display panel, the first layer including a dielectric material, and a second layer (e.g., the second layer 320 of FIG. 3) having a second edge (e.g., the second edge 512 of FIG. 5A) at least part of which is formed outside the edge of the flexible display panel, and disposed under the first layer.

According to an example embodiment, the second layer may include at least one of a digitizer and a metal plate.

According to an example embodiment, the first layer may further include a dielectric layer extending from the first edge, and the dielectric layer may have an edge corresponding to an edge of the flexible display panel.

According to an example embodiment, the display structure may include an adhesive layer disposed between the flexible display panel and the first layer, and the adhesive layer may have an edge corresponding to the first edge of the first layer.

According to an example embodiment, the first layer may include a carbon fiber reinforced plastic (CFRP).

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
   a housing comprising: a first housing including a first side surface of the electronic device, a second housing including a second side surface corresponding to the first side surface, and a hinge connecting the first housing and the second housing, the electronic device configured to be switchable between a folded state and an unfolded state via the hinge;
   a wireless communication circuit disposed inside the housing and configured to transmit and/or receive a signal of a specified frequency by feeding to at least a part of the housing; and
   a display structure coupled to the housing,
   wherein the display structure comprises:
   a cover glass coupled to the housing and forming at least a part of a front surface of the electronic device;

a display panel disposed adjacent to a surface of the cover glass;

a first layer comprising a dielectric material and disposed under the display panel, wherein a first edge of the first layer is spaced apart from the first side surface by a first distance; and a second layer disposed under the first layer, wherein a second edge of the second layer corresponding to the first edge of the first layer is spaced apart from the first side surface by a second distance less than the first distance, and wherein an edge of the display panel corresponding to the first edge of the first layer is spaced apart from the first side surface by a third distance greater than the second distance and less than the first distance.

2. The electronic device of claim 1, wherein the second edge and the edge of the display panel are disposed between the first edge and the first side surface, when viewed from a direction perpendicular to a front surface of the electronic device.

3. The electronic device of claim 1, wherein the second layer comprises at least one of a digitizer or a metal plate.

4. The electronic device of claim 1, wherein the first layer comprises a carbon fiber reinforced plastic (CFRP).

5. The electronic device of claim 1, wherein the first layer further comprises a dielectric layer extending from the first edge, and the dielectric layer has a permittivity of 6 or less.

6. The electronic device of claim 1, wherein the dielectric material has a permittivity of 150 or more.

7. The electronic device of claim 1, wherein the first edge of the first layer, the second edge of the second layer, and the edge of the display panel are formed in a region of the housing corresponding to a region configured to operate as an antenna radiator by being fed from the wireless communication circuit.

8. The electronic device of claim 1, wherein the first edge of the first layer, the second edge of the second layer, and the edge of the display panel are formed in a region spaced a specified distance apart from the hinge.

9. The electronic device of claim 1, comprising an adhesive layer disposed between the display panel and the first layer, wherein the adhesive layer has an edge corresponding to the first edge of the first layer.

10. The electronic device of claim 1, wherein the first layer comprises a lattice pattern in at least a portion thereof.

11. An electronic device comprising:

a housing comprising a first housing including a first side surface of the electronic device, a second housing including a second side surface corresponding to the first side surface, and a hinge connecting the first housing and the second housing, the electronic device configured to be switchable to a folded and/or unfolded state about the hinge; and a display structure coupled to the housing, wherein the display structure comprises:

a cover glass coupled to the housing and forming at least a part of a front surface of the electronic device;

a display panel disposed proximate to a surface of the cover glass;

a first layer comprising a dielectric material and disposed under the display panel, wherein a first edge of the first layer is spaced a first distance apart from the first side surface; and a second layer disposed under the first layer, wherein a second edge of the second layer corresponding to the first edge of the first layer is spaced apart from the first side surface by a second distance less than the first distance, and wherein an edge of the display panel corresponding to the first edge of the first layer is spaced apart from the first side surface by a third distance greater than the second distance and less than the first distance.

12. The electronic device of claim 11, wherein the second edge of the second layer and an edge of the display are formed between the first edge of the first layer and the first side surface, when viewed from a direction perpendicular to the front surface of the electronic device.

13. The electronic device of claim 11, further comprising a wireless communication circuit electrically connected to at least a part of the housing, wherein the wireless communication circuit is configured to transmit and/or receive a signal of a specified frequency band by feeding to at least a part of the housing.

14. The electronic device of claim 11, wherein the first housing comprises a first portion, a second portion extending vertically from the first portion, and a third portion extending vertically from the second portion and in parallel to the first portion, and the first edge of the first layer, the second edge of the second layer, and the edge of the display panel are formed in a region of the first portion corresponding to a region spaced a specified distance apart from the hinge.

15. The electronic device of claim 14, further comprising an alignment mark extending from the second layer and formed in a region corresponding to the first portion.

16. A display structure comprising:

a cover glass forming a first outer surface of the display structure;

a flexible display panel disposed under the cover glass;

a first layer having a first edge at least part a part of which is formed inside an edge of the flexible display panel, and is disposed under the flexible display panel, the first layer comprising a dielectric material; and a second layer having a second edge at least part of which is formed outside the edge of the flexible display panel, and is disposed under the first layer, wherein the second layer comprises at least one of a digitizer or a metal plate.

17. The display structure of claim 16, wherein the first layer further comprises a dielectric layer extending from the first edge, and the dielectric layer has an edge corresponding to the edge of the flexible display panel.

18. The display structure of claim 16, comprising an adhesive layer disposed between the flexible display panel and the first layer, wherein the adhesive layer has an edge corresponding to the first edge of the first layer.

19. The display structure of claim 16, wherein the first layer comprises a carbon fiber reinforced plastic (CFRP).

* * * * *